United States Patent [19]
Rzeszewski

[11] Patent Number: 5,666,430
[45] Date of Patent: Sep. 9, 1997

[54] METHOD AND APPARATUS FOR LEVELING AUDIO OUTPUT

[75] Inventor: Theodore S. Rzeszewski, Lombard, Ill.

[73] Assignee: Matsushita Electric Corporation of America, Franklin Park, Ill.

[21] Appl. No.: 370,397

[22] Filed: Jan. 9, 1995

[51] Int. Cl.[6] .................................... H03G 3/00
[52] U.S. Cl. .............................. 381/107; 381/102
[58] Field of Search .......................... 381/104, 106, 381/107, 102, 108, 109; 455/2, 34.1

[56] References Cited

U.S. PATENT DOCUMENTS

| | | | |
|---|---|---|---|
| 4,430,747 | 2/1984 | Streeter . | |
| 4,539,526 | 9/1985 | Davis | 330/144 |
| 4,546,326 | 10/1985 | Van Uffelen et al. | 330/129 |
| 5,130,665 | 7/1992 | Walden . | |
| 5,301,236 | 4/1994 | Iizuka et al. | 381/107 |
| 5,396,562 | 3/1995 | Ishimitsu et al. | 381/107 |
| 5,404,315 | 4/1995 | Nakano et al. | 381/107 |

OTHER PUBLICATIONS

Sound A1, p. 9 and block diagram.

Interchannel audio level variations: A progress report, May 1994; Communications Technology/Back to Basics.

*Primary Examiner*—Curtis Kuntz
*Assistant Examiner*—Duc Nguyen
*Attorney, Agent, or Firm*—McDermott, Will & Emery

[57] ABSTRACT

A microcomputer for automatically controlling an audio output from a receiver. The microcomputer calculates a power signal corresponding to the power of a detected audio input signal, determines whether the calculated power signal is above or below a predetermined power value, generates a power control signal in response to whether the calculated power signal is above or below said predetermined value, and uses the power control signal to automatically maintain a substantially constant audio output from the receiver. In another embodiment, a separate detection circuit calculated the power signal and feeds it to the microcomputer.

6 Claims, 6 Drawing Sheets

METHOD AND APPARATUS FOR LEVELING AUDIO OUTPUT

FIELD OF THE INVENTION

This invention relates in general to the audio output of a receiver. More particularly, it relates to an apparatus and method for maintaining a substantially level audio output from a television receiver.

BACKGROUND OF THE INVENTION

The loudness of the audio output from a television receiver often changes from program to commercial on a given channel, from program to program on a given channel, and from channel to channel. Additionally, many television programs and most motion pictures intentionally vary loudness from scene to scene to simulate how the sounds would be experienced in real life. For example, a gun shot or a cheering crowd at a football game are louder than two people having a face-to-face conversation in a room.

However, such real life loudness variations, while having some value in a movie theater, are often a source of annoyance when viewing television at relatively close range in a relatively confined area. In response, some television manufacturers have incorporated automatic volume leveling (AVL) circuitry in their televisions. Such AVL circuits are similar to analog leveling circuitry found in various audio products such as tape recorders. While these analog AVL circuits provide some relief from loudness variations, they generally suffer from having a limited volume hold time for quiet passages, slow attack and decay (release) times constants, and the additional cost of the AVL circuitry.

Accordingly, it would be advantageous to provide an automatic audio leveling apparatus and method that would provide infinite hold time for quiet passages, fast and precise attack and decay times, and eliminate the need for additional circuitry.

SUMMARY OF THE INVENTION

Thus, it is an object of the present invention to provide a low cost method and apparatus for maintaining a substantially constant audio output from a receiver.

It is another object of the present invention to provide a method and apparatus capable of relatively fast and precise response times in maintaining a substantially constant audio output from a receiver.

It is yet another object of the present invention to provide a method and apparatus capable of maintaining a substantially constant audio output from a receiver during quiet passages.

It is still another object of the present invention to provide a precise, efficient, reliable, and easily implemented method and apparatus for maintaining a substantially constant audio output from a receiver.

These and other objects are realized in accordance with the present invention by providing a microcomputer for automatically controlling an audio output from a receiver. The microcomputer calculates a power signal corresponding to the power of a detected audio input signal, determines whether the calculated power signal is above or below a predetermined power value, generates a power control signal in response to whether the calculated power signal is above or below the predetermined value, and uses the power control signal to automatically control the receiver's audio output and maintain a substantially constant audio output.

In another embodiment, the method and apparatus of the present invention is implemented as a detection circuit in communication with a microcomputer. The detection circuit calculates a power signal corresponding to the power of a detected audio input signal. The microcomputer determines whether the calculated power signal is above or below a predetermined power value, generates a power control signal in response to whether the calculated power signal is above or below the predetermined value, and uses the power control signal to automatically maintain a substantially constant audio output from the receiver.

Accordingly, the present invention achieves several advantages. In particular, when the receiver is a television, the method and apparatus of the present invention saves manufacturing costs and complexity by incorporating its audio leveling operations into the microcomputer that is already present in most current televisions. The speed and precision of the computer-implemented present invention is superior to prior art analog audio leveling circuits, thereby decreasing response times, allowing quiet passages to be maintained indefinitely, and allowing the necessary audio adjustments to be made in real time.

The invention itself, together with further objects and attendant advantages, will be understood by reference to the following detailed description, taken in conjunction with the accompanying drawings.

DETAILED DESCRIPTION OF THE PRESENTLY PREFERRED EMBODIMENTS

The present invention uses a microcomputer (MPU) to automatically maintain a substantially constant audio output from a receiver. When the present invention is implemented in a television receiver, the microcomputer may be the conventional microprocessor found in most currently available television receivers. Preferably, the microprocessor would be capable of completing a variety of both simple and complex calculations in real time. However, if the chosen microprocessor is not capable of performing the required calculations, or is not capable of completing the calculations in real time, optional pre-processing circuitry may be provided for performing the required power calculations and then feeding the results to the microprocessor for further processing. Such pre-processing circuitry, however, is less complex and costly than conventional analog automatic volume leveling circuitry. Ideally, the microcomputer would be implemented as a digital signal processor, which is capable of handling the required power calculations precisely and in real time.

Figure 1:
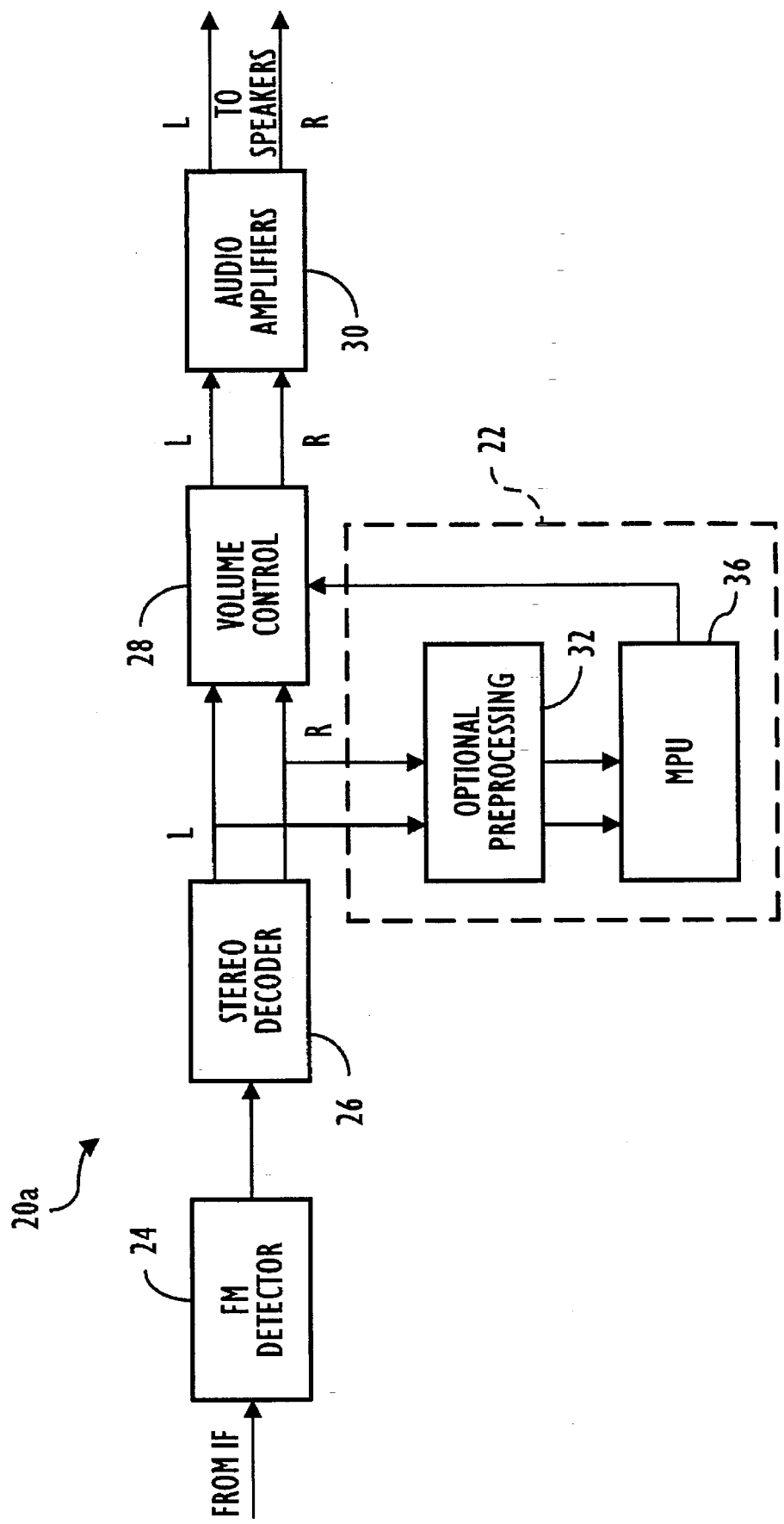
FIG. 1 is a block diagram of an audio signal path incorporating a "forward-control" audio leveling apparatus embodying the present invention.

FIG. 1 illustrates an audio signal path 20a that includes an audio leveling apparatus 22 embodying the method and apparatus of the present invention. As shown in FIG. 1, the audio leveling apparatus 22 accepts the left (L) and right (R) audio output from a stereo decoder 26 for automatically controlling a volume controller 28. The audio leveling apparatus 22 preferably includes at least a microcomputer 36, and may optionally include pre-processing circuitry 32.

Other than the audio leveling apparatus 22, the components of the audio signal path 20a shown in FIG. 1 are conventional. As shown in FIG. 1, a conventional FM detector 24 receives an input audio signal from an upstream IF (intermediate frequency) filter and amplifier (not shown). The FM detector 24 detects the frequency-modulated audio information and feeds it to a stereo decoder 26. The decoder 26 decodes the frequency-modulated audio information, divides it into left (L) and right (R) components, and feeds L and R to the volume controller 28. The volume controller 28 outputs L and R to audio amplifiers 30 which feed amplified L and R signals to conventional loudspeakers (not shown).

The volume controller 28 is controlled by the audio leveling apparatus 22. The microcomputer 36 of the audio leveling apparatus 22 may function in a conventional manner to control the volume controller 28 and thereby control the volume output from the speakers. In accordance with the present invention, the microcomputer 36 and pre-processing circuitry 32 also perform automatic volume leveling by accepting L and R from the stereo decoder 26, and generating a control signal output to the volume controller 28. The control signal automatically compensates for power variations in the incoming L and R signals to maintain a substantially constant volume output from the speakers. If the chosen microcomputer 36 is of the type that is capable of performing the required pre-processing calculations in real time, the optional pre-processing circuitry 32 may be eliminated, and L and R may be fed directly from the stereo decoder 26 to the microcomputer 36. Because the L and R inputs to the audio leveling apparatus 22 shown in FIG. 1 are taken from upstream of the volume controller 28, the audio leveling apparatus' connection to the main portion of the audio signal path 20a may be characterized as a "forward-control" configuration.

Figure 2:
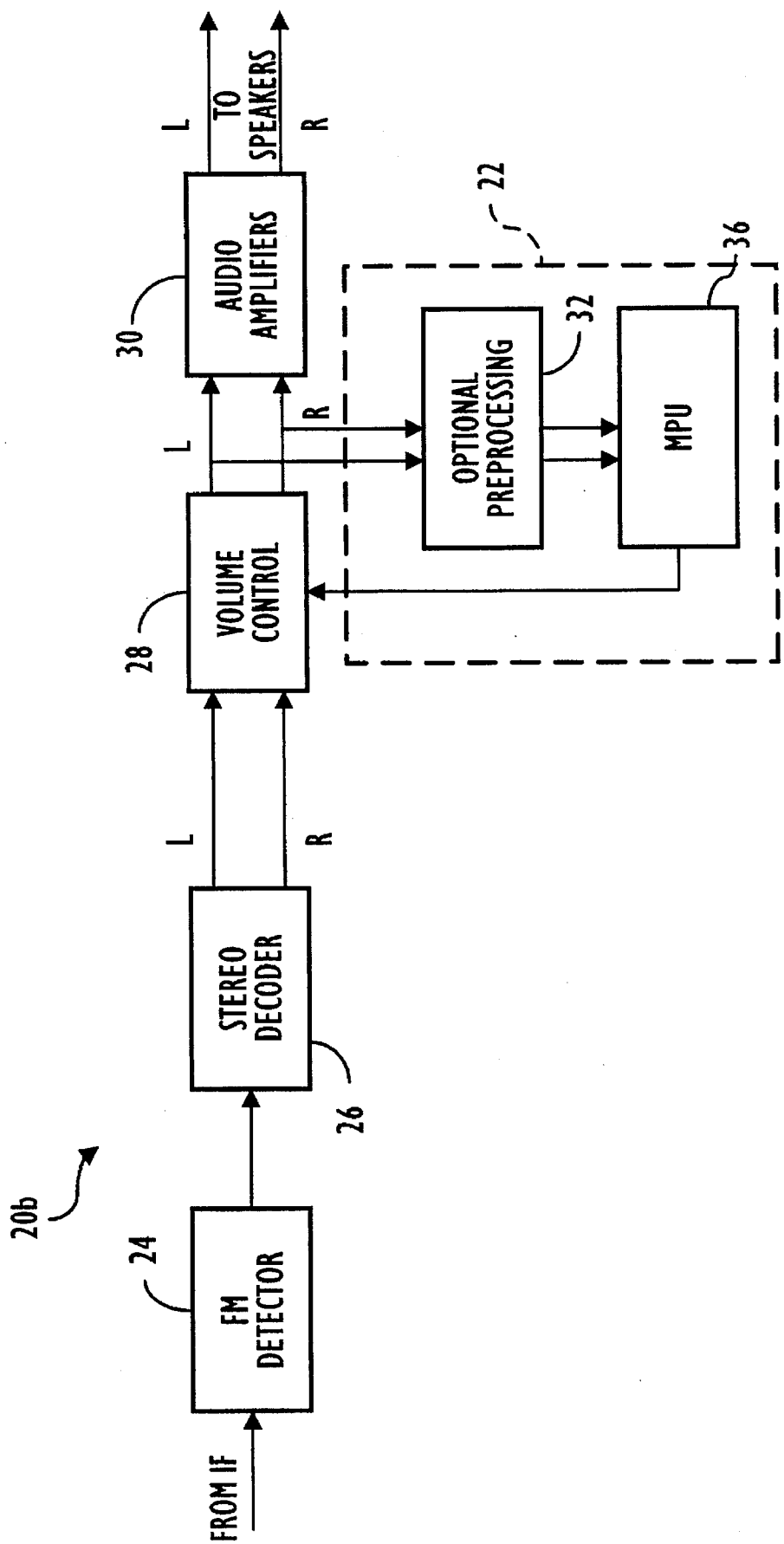
FIG. 2 is a block diagram of an audio signal path incorporating a "feedback" audio leveling apparatus embodying the present invention.

FIG. 2 is a block diagram of another audio signal path 20b incorporating the audio leveling apparatus 22. Because the L and R inputs to the audio leveling apparatus 22 shown in FIG. 1 are taken from downstream of the volume controller 28, the audio leveling apparatus' connection to the main portion of the audio signal path may be characterized as a "feedback" configuration. Otherwise all of the elements shown in FIG. 2 are substantially the same as the corresponding elements shown in FIG. 1.

Figure 3:
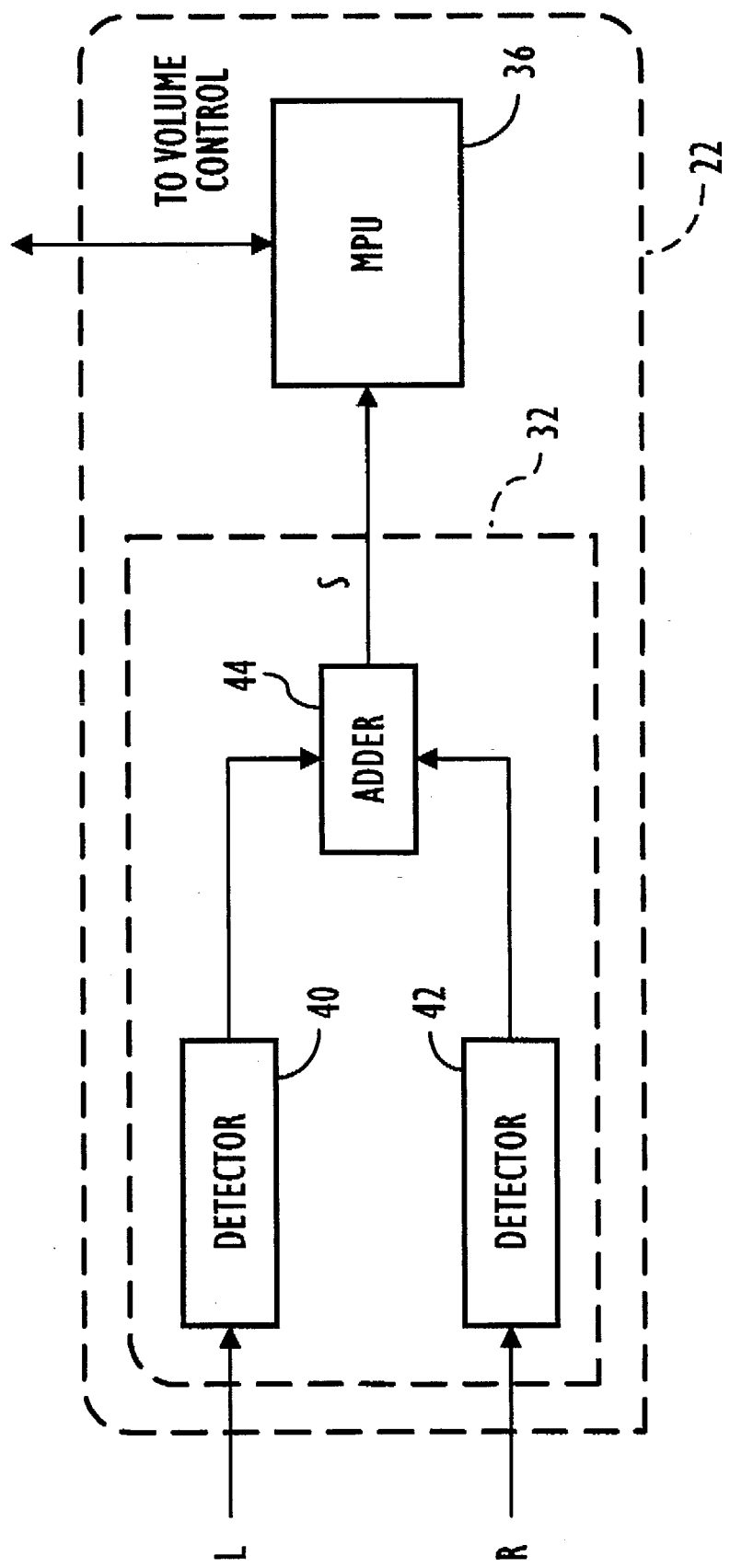
FIG. 3 is a block diagram illustrating the audio leveling apparatus shown in FIGS. 1 and 2, and more particularly illustrating details of the optional pre-processing circuitry shown in FIGS. 1 and 2.

FIG. 3 illustrates a preferred embodiment of the audio leveling apparatus 22 shown in FIGS. 1 and 2. More particularly, FIG. 3 illustrates a preferred embodiment of the optional pre-processing circuitry 32. As illustrated, the pre-processing circuitry 32 includes detectors 40, 42 for detecting the L and R audio signals, along with an adder circuit 44 for receiving and combining the L and R outputs from the detectors 40, 42.

The detectors 40, 42 generate L and R power signals that correspond to the power of the input L and R audio signals. This can be accomplished in a number of ways, for example by calculating a root-mean-square, envelope, average, or others. Because the power of an audio signal is directly proportional to its loudness, the L and R power signals are directly proportional to the loudness of the received audio signal. The adder 44 sums the L and R power signals into a single output power signal S. The single power signal S is then supplied to the microcomputer 36, which uses the signal S to control the volume of the speakers (not shown).

Figure 4:
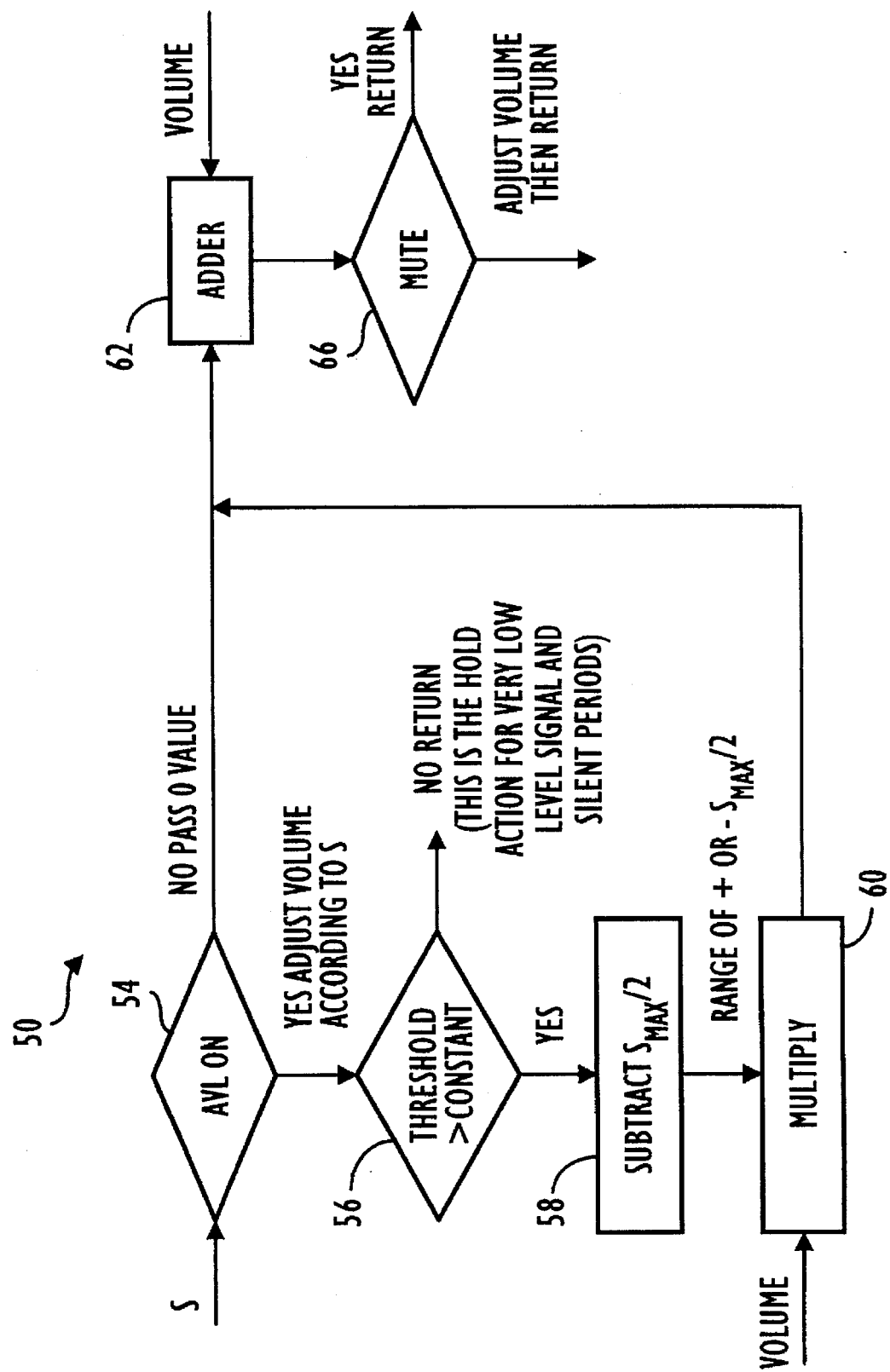
FIG. 4 is a high-level illustration of program instructions further embodying the present invention. The illustrated program may be executed by the microcomputer portion of the apparatus shown in FIGS. 1, 2 and 3.

Turning now to FIG. 4, there is illustrated a flow diagram of a leveling program 50, which is preferably executed by the microcomputer 36. At block 54, the program 50 determines whether the automatic volume leveling function has been activated by the user. If not, block 54 passes a zero value to an adder 62, which accordingly adds nothing to the volume level. If the automatic volume level function is determined to be on at block 54, the leveling program 50 moves to block 56 where it determines whether the power signal S is greater than a predetermined threshold. If the answer to the inquiry at block 56 is no, the program 50 returns to its start, and no change is made to the volume level. It is assumed that any power level below a predetermined threshold is intended to be a quiet scene, thus any attempt to compensate the volume in such a situation may result in unwanted noise or other unnatural variations in the volume output.

If the power signal S exceeds the threshold at block 56, the leveling program 50 moves to block 58 which determines whether the power signal S is above or below a nominal zero value for the power signal S. In the preferred embodiment, the nominal zero value is determined by setting Smax to a maximum acceptable value of S, and then dividing Smax by two. Smax/2 is then subtracted from the received power signal S to determine whether S is above or below the nominal value. Of course, the nominal zero value of S could be changed by dividing Smax by a number other than 2, such as 3 or 4, depending on the particular requirements of the design. The output of block 58 is a control signal falling within the range of +Smax/2 to –Smax/2.

The control signal is then supplied to a multiplying function 60 which scales the control signal by multiplying it by the audio volume level set by the user. This is done to ensure that when the volume level is set high, the range of volume change (–Smax/2 to +Smax/2) is greater than when the volume level is set relatively lower. The output of the multiplying function 60 is then applied to the adder operation 62, which adds the scaled control signal to the volume level setting. The scaled control signal is either positive or negative, depending upon whether S was above or below nominal zero (Smax/2). If S was above nominal zero, the control signal is negative, and the volume is reduced. If S was below nominal zero, the control signal is positive, and the volume is increased.

The output of the adder operation 62 is then supplied to the volume controller 28 (shown in FIGS. 1 and 2) through the mute operation 66. If the mute function has been activated by the user, the volume output is suppressed by a predetermined amount. If the mute function has not been activated by the user, the leveled volume control signal passes through the mute operation 66 to the volume controller 28 (shown in FIGS. 1 and 2), and the leveling program 50 returns to its beginning to receive and analyze the next time-divided power signal S.

Figure 5:
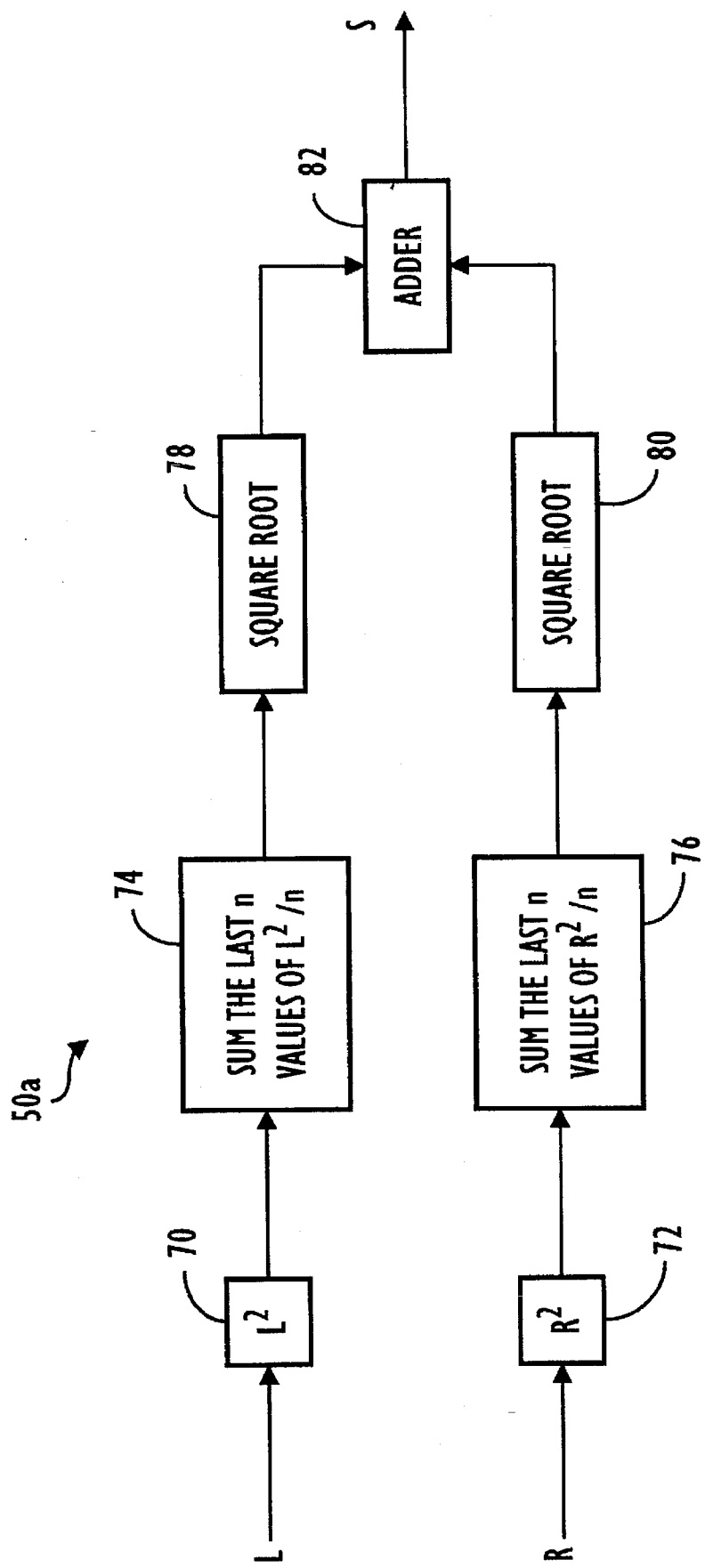
FIG. 5 is a high level illustration of another set of program instructions embodying the present invention. The illustrated program may be executed by the microcomputer portion of the apparatus shown in FIGS. 1, 2, and 3.

Turning now to FIG. 5, there is illustrated another set of program instructions 50a, which are executed by the microcomputer 36 when the optional pre-processing circuitry 32 (shown in FIGS. 1 through 3) is not utilized. In this case, the microcomputer 36 performs the power-related calculations (which were previously described in connection with the optional pre-processing circuitry) in addition to determining the required volume adjustments (as performed by the leveling program 50 illustrated in FIG. 4)

As shown in FIG. 5, the program 50a begins by squaring the L audio signal at block 70 and squaring the R audio signal at block 72. L is then passed to block 74, and R is passed to block 76. Blocks 74 and 76 calculate an average value by summing the last "n" values and dividing that sum by n. Precision is increased and response times are decreased by making the proper adjustments to n. The outputs of blocks 74, 76 are then fed to blocks 78, 80 which calculate square roots of the average (time-divided) L and R values. Thus, blocks 74, 76, 78 and 80 effectively perform a root means square operation in order to determine the power levels of the L and R audio. The output of the square root blocks 78, 80 are then fed to an adder 82, which adds L and R and outputs the power signal S. This time-divided power signal, S, is supplied to the beginning of the leveling program routine 50 illustrated in FIG. 4.

Figure 6:
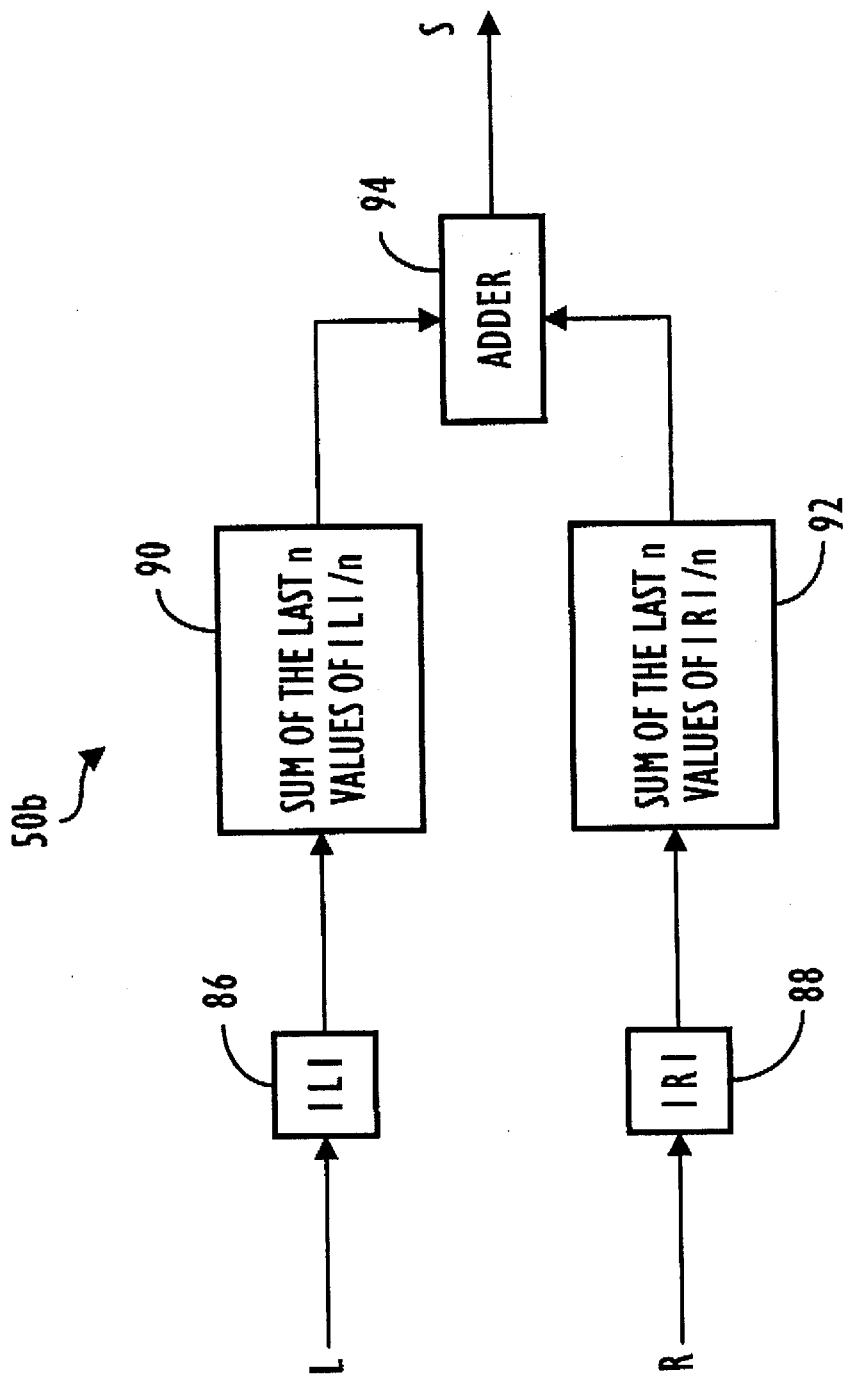
FIG. 6 is a high-level illustration of still another set of program instructions embodying the present invention. The illustrated program may be executed by the microcomputer portion of the apparatus shown in FIGS. 1, 2, and 3.

FIG. 6 illustrates yet another program 50b for determining the power level of the received audio signal. As shown in FIG. 6, the program 50b determines the absolute value of L and R at blocks 86, 88. The outputs of blocks 86, 88 are then fed to blocks 90, 92 which determine the average of L and R by summing the last "n" values of L and R and dividing that sum by n. As with the program 50a shown in FIG. 5, precision is increased and response times are decreased by making the proper adjustments to n. The average L and R signals are then added at an adder 94 which then outputs the time-divided power signal S.

Thus, the microcomputer 36, and optionally the pre-processing circuitry 32, develop a control signal that adds to or subtracts from the static volume output from the television receiver. In general, the control signal adds to the static volume if the received power value is lower than a predetermined value, and subtracts from the static volume if the received power signal is higher than the predetermined value. In general, it is believed to be advantageous to set the nominal predetermined power value to correspond to 30% modulation because television broadcasts target volume levels which are nominal from the transmitter at 30% modulation. Thus, using the present invention, the zero value of S would be set to correspond to 30% modulation.

Accordingly, the above-described invention achieves several advantages. In particular, the method and apparatus of the present invention saves manufacturing costs and complexity by incorporating its audio leveling operations into a microcomputer of the type already found in most current televisions. The speed and precision of the computer-implemented present invention is superior to prior art analog audio leveling circuits, thereby decreasing response times and allowing the necessary audio adjustments to be made in real time.

If desired, the processing steps described herein could be altered by combining L and R early in the signal path and processing a single signal. Also, a single signal path would be needed for monaural signals.

It is therefore intended that the foregoing detailed description be regarded as illustrative rather than limiting, and that it be understood that it is the following claims, including all equivalents, which are intended to define the scope of the invention.

I claim:

1. A process for controlling an audio output from a receiver, comprising the following steps:

calculating a power signal corresponding to the power of a detected audio signal input signal;

determining whether said power signal is above or below a predetermined power value;

generating a power control signal in response to whether said power signal is above or below said predetermined power value; and using said power control signal to automatically maintain a substantially constant audio output from the receiver; and scaling said power control signal to correspond to a volume setting of the receiver, wherein said scaled power signal comprises a first value for a first power signal and a first volume setting and a second value for second power signal and a second volume setting, and wherein said first value is relatively smaller than said second value when said first power signal is substantially the same as said second power signal and said first volume setting is less than said second volume setting.

2. The process of claim 1, wherein said step of using said power control signal to automatically maintain a substantially constant audio output comprises, adding said scaled power control signal to said volume setting.

3. An apparatus for automatically controlling an audio output from a receiver, said apparatus comprising:

a detection circuit for calculating a power signal corresponding to the power of a detected audio input signal; and a microcomputer for determining whether said power signal is above or below a predetermined power value, for generating a power control signal in response to whether said power signal is above or below said predetermined value, for using said power control signal to automatically maintain a substantially constant audio output from the receiver, and for scaling said power control signal to correspond to a volume setting of the receiver, wherein said scaled power control signal comprises a first value for a first power signal and a first volume setting, and a second value for a second power signal and a second volume setting, and wherein said first value is relatively smaller than said second value when said first power signal is substantially the same as said second power signal and said first volume setting is less than said second volume setting.

4. The invention of claim 3, wherein said using of said power control signal to automatically maintain a substantially constant audio output comprises, an adder for adding said power control signal to said volume setting.

5. The process of claim 2, wherein said scaled power control signal is negative if below said predetermined power value, and wherein said scaled power control signal is positive if above said predetermined power value.

6. The invention of claim 4, wherein said scaled power control signal is negative if below said predetermined power value, and wherein said scaled power control signal is positive if above said predetermined power value.

* * * * *

UNITED STATES PATENT AND TRADEMARK OFFICE
CERTIFICATE OF CORRECTION

PATENT NO. : 5,666,430
DATED : September 9, 1997
INVENTOR(S) : Theodore S. RZESZEWSKI It is certified that error appears in the above-indentified patent and that said Letters Patent is hereby corrected as shown below:

Col. 6, Line 5, After "for" insert --a--

Signed and Sealed this

Twenty-second Day of September, 1998

Attest:

BRUCE LEHMAN

*Attesting Officer*  *Commissioner of Patents and Trademarks*